United States Patent [19]
Kakimoto et al.

[11] Patent Number: 5,214,663
[45] Date of Patent: May 25, 1993

[54] SEMICONDUCTOR LASER

[75] Inventors: Syoichi Kakimoto; Tomoko Kadowaki; Toshitaka Aoyagi; Kazuhisa Takagi, all of Itami, Japan

[73] Assignee: Mitsubishi Denki Kabushiki Kaisha, Tokyo, Japan

[21] Appl. No.: 818,354

[22] Filed: Jan. 9, 1992

[30] Foreign Application Priority Data

Feb. 5, 1991 [JP] Japan ................................. 3-038085

[51] Int. Cl.$^5$ ............................................. H01S 3/19
[52] U.S. Cl. ..................................................... 372/45
[58] Field of Search ............................... 372/45, 46, 44

[56] References Cited
U.S. PATENT DOCUMENTS 4,901,326  2/1990  Hayakawa et al. .................... 372/45

Primary Examiner—James W. Davie
Attorney, Agent, or Firm—Leydig, Voit & Mayer

[57] ABSTRACT

A semiconductor laser includes a p type cladding layer and an n type cladding layer sandwiching an active layer serially disposed on a semiconductor substrate. The p type cladding layer includes a first dopant impurity producing p type conductivity and a smaller quantity of a second impurity that produces n type conductivity and ionically bonds to the first impurity. The first and second dopant impurities attract each other and cannot move individually during a crystal growth step at high temperature whereby the diffusion of those impurities into the active layer is suppressed, preventing formation of a deep impurity level in the active layer, resulting in a semiconductor laser with a reduced threshold current.

21 Claims, 6 Drawing Sheets

F I G. 4
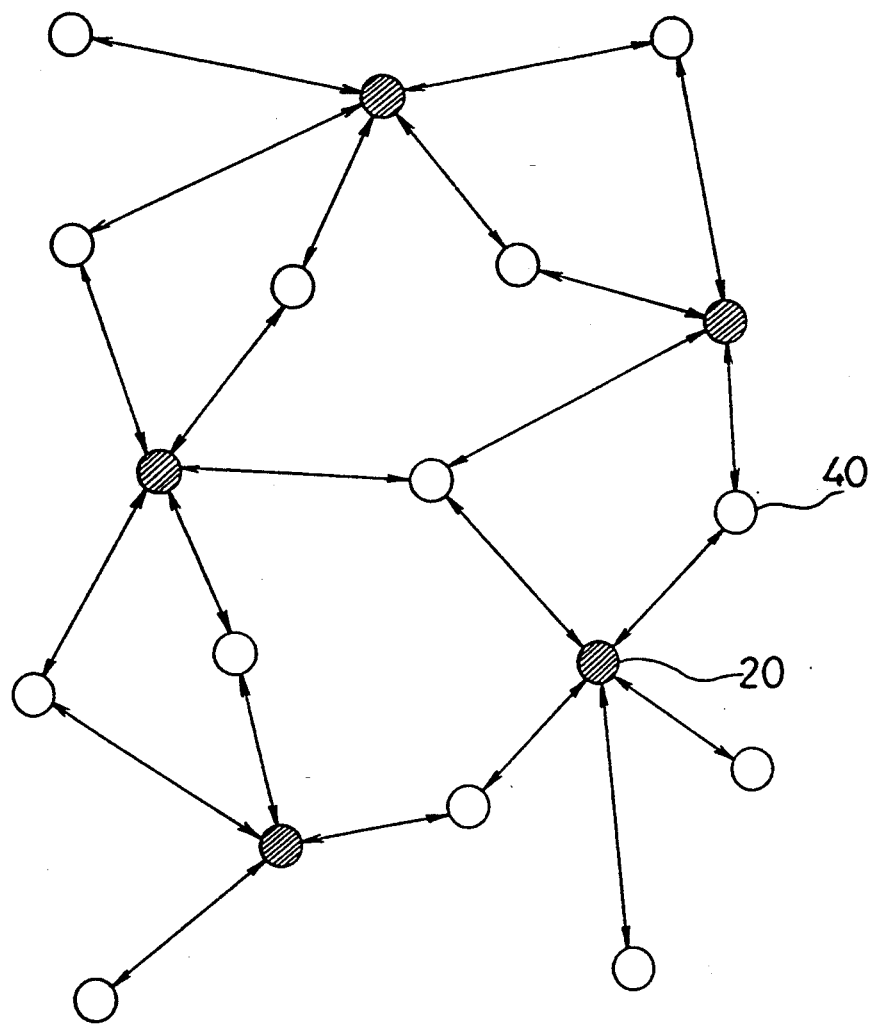

SEMICONDUCTOR LASER

FIELD OF THE INVENTION

The present invention relates to a semiconductor laser and a production method therefor.

BACKGROUND OF THE INVENTION

FIGS. 6(a) to 6(e) are cross-sectional views illustrating process steps of a prior art method for producing a semiconductor laser. In figures, reference numeral 1 designates an n type GaAs substrate. An n type AlInGaP cladding layer 2 is disposed on the substrate 1 and an InGaP active layer 3 is disposed thereon. A p type AlInGaP cladding layer 4 having a mesa ridge is disposed on the cladding layer 4 at the active layer 3. An n type GaAs layer 5 is disposed on both sides of the mesa ridge. A p type GaAs layer 6 is disposed on the n type GaAs layer 5 and the p type AlInGaP cladding layer 4. An n side electrode 7 and a p side electrode 8 are disposed on the rear surface of the substrate 1 and the surface of the p type GaAs layer 6, respectively.

First, as shown in FIG. 6(a), an n type AlInGaP cladding layer 2, an InGaP active layer 3, and a p type AlInGaP cladding layer 4 are successively grown on the GaAs substrate 1 (first crystal growth). Generally, silicon is added to the n type AlInGaP cladding layer 2 as an n type dopant and zinc is added to the p type AlInGaP cladding layer 4 as a p type dopant. Then, an etching mask 10 is patterned on the p type AlInGaP cladding layer 4 and the p type AlInGaP cladding layer 4 is partially etched away using the etching mask 10 leaving a stripe-shaped mesa, as shown in FIG. 6(b). Thereafter, as shown in FIG. 6(c), an n type GaAs layer 5 is formed on both sides of the stripe-shaped mesa using the mask 10 as a mask for the selective growth (second crystal growth). After removing the mask 10, a p type GaAs layer 6 is formed on the mesa and the n type GaAs layer 5 as shown in FIG. 6(d) (third crystal growth). Finally, an n side electrode 7 and a p side electrode 8 are formed on the rear surface of the n type GaAs substrate 1 and the surface of the p type GaAs layer 6, respectively, completing a laser structure shown in FIG. 6(e).

A description is given of the operation.

When a forward bias voltage is applied across the n side electrode 7 and the p side electrode 8, current flows between the electrodes 7 and 8. This current produces electrons in the n type cladding layer 2 and holes in the p type cladding layer 4, and these electrons and holes are injected into the active layer 3 and recombine with each other, thereby generating light whose wavelength corresponds to the energy band gap of the active layer 3, i.e., approximately 670 nm.

When the current flowing in the laser increases and reaches a threshold value, laser oscillation begins and laser light having a wavelength corresponding to the energy band gap of the active layer 3 is produced. When the active layer 3 is formed of InGaP, red laser light having a wavelength of approximately 670 nm is produced. After the current exceeds the threshold value, the output laser light increases in proportion to the increase in the current.

In the above-described prior art semiconductor laser, selenium or silicon is employed as an n type dopant for the n type AlInGaP cladding layer 2 and zinc is employed as a p type dopant for the p type AlInGaP cladding layer 4.

However, the prior art semiconductor laser has the following drawbacks:

Zinc atoms and selenium atoms are likely to move in the layers at a high temperature. Therefore, as shown in FIGS. 6(c) and 6(d), zinc atoms in the p type cladding layer 4 are likely to diffuse into the active layer 3 at the high temperature of the second and third crystal growth processes. Similarly, when selenium is used as an n type dopant, selenium atoms in the n type cladding layer 2 are likely to diffuse into the active layer 3 at the high temperature of the second and third crystal growth processes. As shown in FIG. 7, zinc atoms or selenium atoms diffused into the active layer 3 form a deep impurity level 14. Usually, electrons in the conduction band directly recombine with holes in the valence band in the active layer 3 as shown in FIG. 7 and light of wavelength 1 corresponding to the energy band gap of the active layer 3 is produced. However, since the deep impurity level 14 is present in the active layer 3, when electrons in the n type cladding layer 2 and holes in the p type cladding layer 4 are injected into the active layer 3 by a forward direction current, the electrons 12 in the conduction band recombine with the holes 13 in the valence band not directly but via the above-described deep impurity level 14. Such a recombination of electrons and holes generates light of wavelength $\lambda_2$ which does not contribute to the laser oscillation. In order to oscillate, it is necessary to sufficiently generate the light of wavelength $\lambda_1$ which corresponds to the energy band gap of the active layer 3. For that purpose, the electrons in the conductive band and the holes in the valence band recombine directly with each other only after saturating the recombination process via the deep impurity level 14. In this case, however, the threshold current unfavorably rises.

SUMMARY OF THE INVENTION

It is an object of the present invention to provide a semiconductor laser that reduces the threshold current at which laser oscillation begins.

Other objects and advantages of the present invention will become apparent from the detailed description given hereinafter; it should be understood, however, that the detailed description and specific embodiment are given by way of illustration only, since various changes and modifications within the spirit and the scope of the invention will become apparent to those skilled in the art from this detailed description.

In accordance with a semiconductor laser of the present invention, at least one of a p type cladding layer and an n type cladding layer sandwiching an active layer is formed by incorporating first impurities which produce a first conductivity type in the cladding layer, and a smaller quantity of second impurities, which produce a second conductivity type opposite to the first conductivity type the cladding layer and ionically bond with the first impurities. Therefore, the first impurities and the second impurities attract each other and cannot move individually during a crystal growth at a high temperature, whereby diffusion of those impurities into the active layer is suppressed and a deep impurity level is not formed in the active layer, resulting in a semiconductor laser with reduced threshold current.

BRIEF DESCRIPTION OF THE DRAWINGS

FIG. 4 is a diagram schematically illustrating p type dopant atoms and n type dopant atoms which are attracted to each other in the semiconductor laser in accordance with the first embodiment of the present invention;

DETAILED DESCRIPTION OF THE PREFERRED EMBODIMENTS

Figure 1:
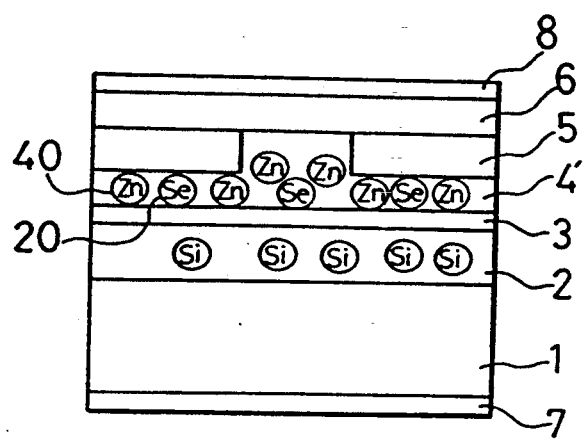
FIG. 1 is a cross-sectional view illustrating a structure of a semiconductor laser in accordance with a first embodiment of the present invention.
Figure 5:
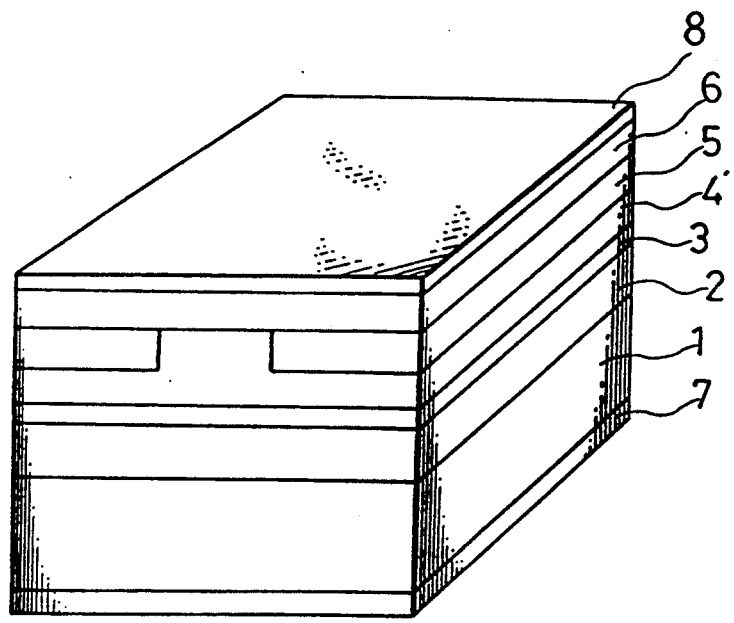
FIG. 5 is a perspective view illustrating a semiconductor laser in accordance with the first or second embodiment of the present invention.
Figure 6A:
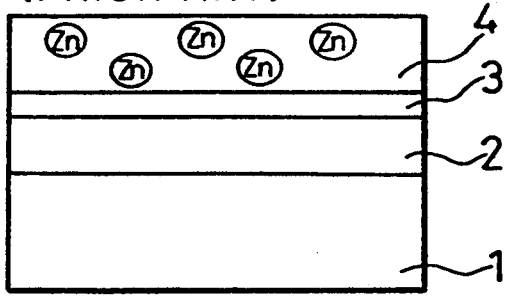
FIGS. 6(a) to 6(e) are cross-sectional views illustrating process steps in a method for producing a semiconductor laser in accordance with the prior art.
Figure 6B:
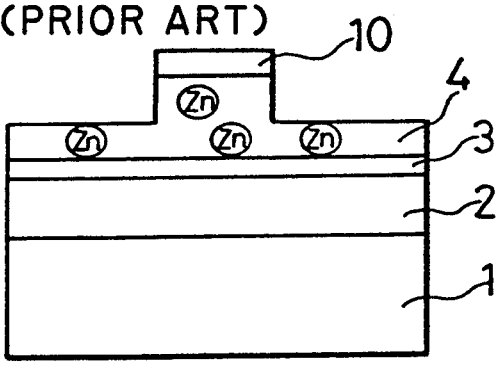
Figure 6C:
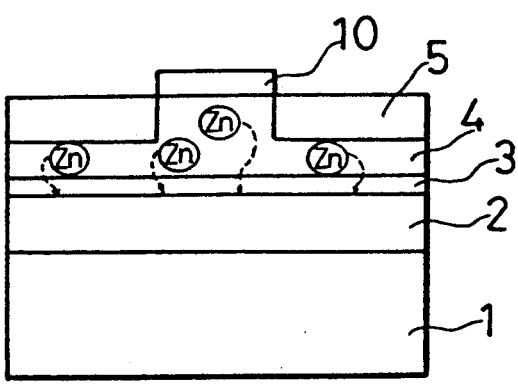
Figure 6D:
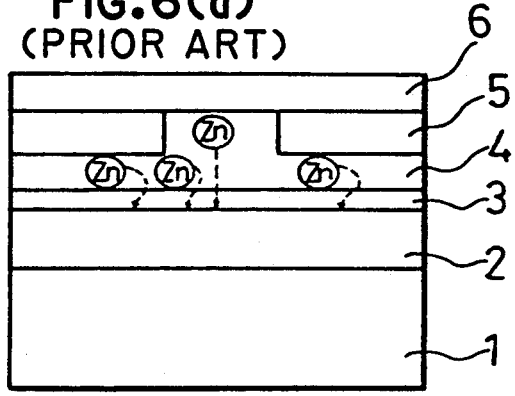
Figure 6E:
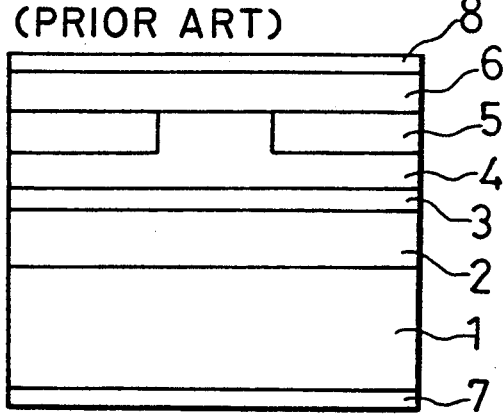
Figure 7:
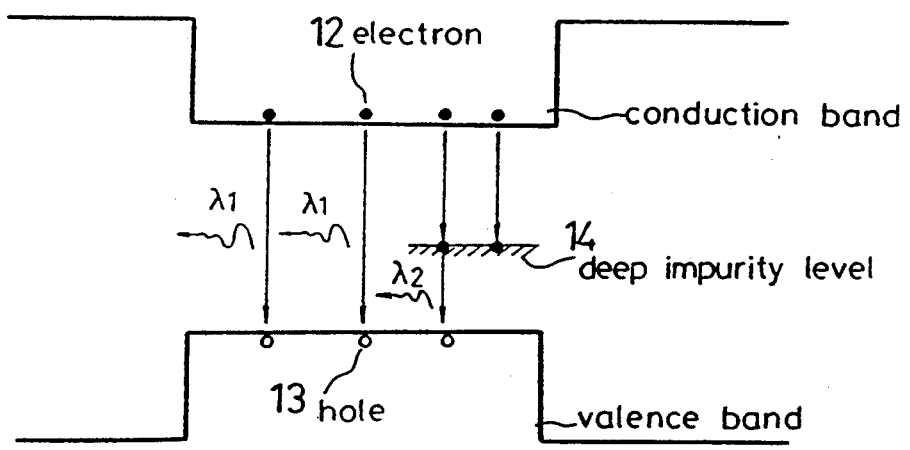
FIG. 7 is a diagram schematically illustrating an energy band structures in an active layer of the prior art semiconductor laser.

FIG. 1 is a cross-sectional view illustrating a structure of a semiconductor laser in accordance with a first embodiment of the present invention and FIG. 5 is a perspective view thereof. In these figures, reference numeral 1 designates an n type GaAs substrate. An n type AlInGaP cladding layer 2 is disposed on the substrate 1 and an InGaP active layer 3 is disposed thereon. A p type AlInGaP cladding layer 4' is disposed on the active layer 3 and a part thereof is etched away to form a mesa ridge. An n type GaAs layer 5 is disposed on the cladding layer 4' at both sides of the mesa ridge. A p type GaAs layer 6 is disposed on the ridge and the n type GaAs layer 5. An n side electrode 7 and a p side electrode 8 are disposed on the rear surface of the substrate 1 and the surface of the p type GaAs layer 6, respectively. The typical thicknesses of these layers are as follows. The n type AlInGaP cladding layer 2 is about 1 micron thick, the InGaP active layer 3 is 0.05 to 0.1 micron thick, the p type AlInGaP cladding layer 4' is about 1 micron thick, the n type GaAs 5 is 0.5 to 1.0 micron thick, the p type GaAs 6 is about 0.5 micron thick, and the n side and p side electrodes 7 and 8 are about 3000 angstroms thick.

FIGS. 3(a) to 3(e) are cross-sectional views illustrating process steps for producing the semiconductor laser of FIG. 1.

Figure 3A:
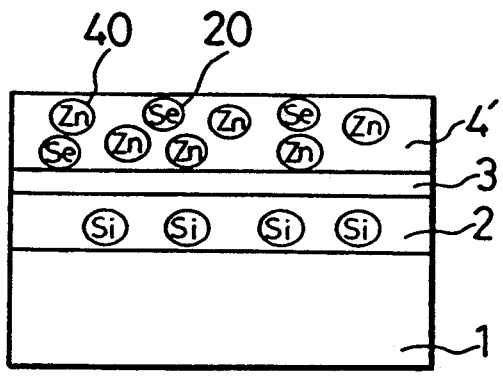
FIGS. 3(a) to 3(e) are cross-sectional views illustrating process steps in a method for producing the semiconductor laser in accordance with the first embodiment of the present invention.
Figure 3B:
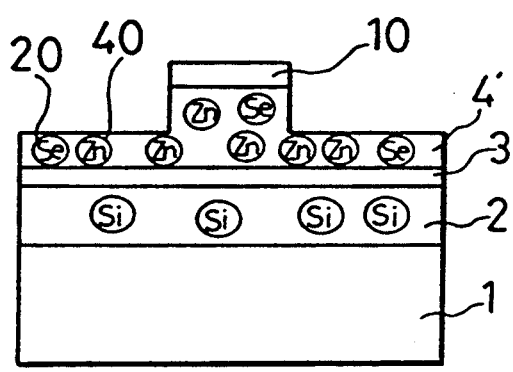
Figure 3C:
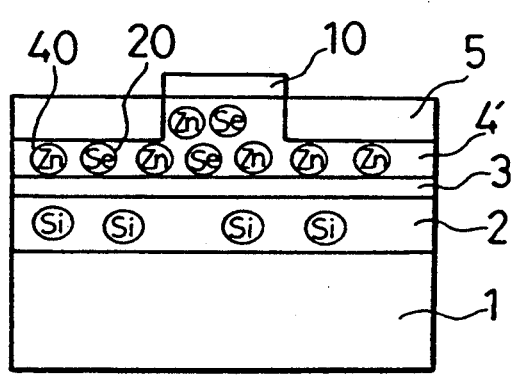
Figure 3D:
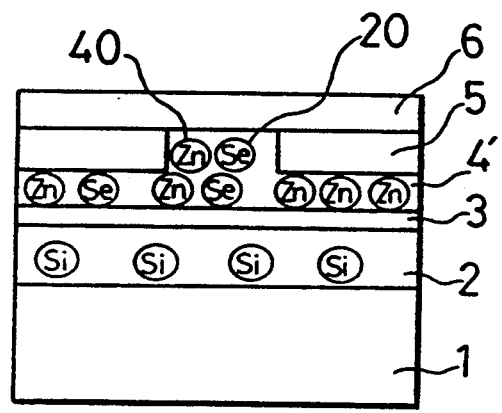
Figure 3E:
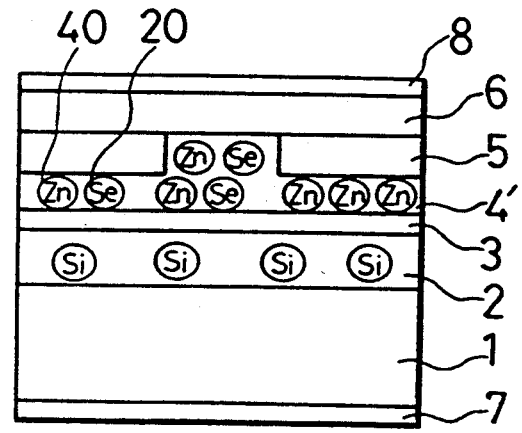

First of all, as shown in FIG. 3(a), an n type AlInGaP cladding layer 2, an InGaP active layer 3 and a p type AlInGaP cladding layer 4' are successively grown on the n type GaAs substrate 1 by metal organic chemical vapor deposition (MOCVD) at a temperature of 500° to 600° C. (first crystal growth). Here, silicon serving as an n type dopant is incorporated into the n type AlInGaP cladding layer 2 and zinc 40 serving as a p type incorporated is doped into the p type AlInGaP cladding layer 4'. Then, as shown in FIG. 3(b), the p type AlInGaP cladding layer 4' is partially etched away leaving a stripe-shaped mesa, using an etching mask 10 comprising such as silicon nitride which is patterned on the p type AlInGaP cladding layer 4'. Then, as shown in FIG. 3(c), an n type GaAs layer 5 is grown on the cladding layer 4' at both sides of the stripe-shaped mesa by MOCVD at a temperature of 500° to 600° C. using the etching mask 10 as a mask for the selective growth (second crystal growth). After removing the mask 10, a p type GaAs layer 6 is grown on the p type AlInGaP cladding layer 4' and the n type GaAs layer 5 by MOCVD at a temperature of 500° to 600° C. as shown in FIG. 3(d) (third crystal growth). Finally, as shown in FIG. 3(e), an n side electrode 7 is formed on the rear surface of the n type GaAs substrate 1 and a p side electrode 8 is formed on the surface of the p type GaAs layer 6.

The function of the semiconductor laser according to the first embodiment will be described in detail.

As shown in FIG. 3(a), zinc 40 serving as a p type dopant is incorporated into the p type cladding layer 4' at a concentration of $1 \times 10^{18}$ cm$^{-3}$. In addition, selenium 20 is also incorporated into the p type cladding layer 4' at a concentration of $5 \times 10^{17}$ cm$^{-3}$, at which concentration the p type conductivity of the cladding layer 4' is not inverted to n type conductivity. As shown in FIG. 4, zinc atoms 40 as p type impurities and selenium atoms 20 as n type impurities attract each other in the p type cladding layer 4'. The connection between the zinc atoms 40 and the selenium atoms 20 is so strong that at the high temperature in the second and third crystal growth steps shown in FIGS. 1(c) and 1(d) the atoms cannot move individually and the zinc atoms are not likely to diffuse into the active layer 3. Therefore, a deep impurity level is not formed in the active layer 3, resulting in a semiconductor laser with a reduced threshold current.

The n type impurity concentration of the selenium atoms, $5 \times 10^{17}$ cm$^{-3}$, is chosen to maintain a desired p type impurity concentration. More specifically, the zinc atoms 40 having a concentration of $1 \times 10^{18}$ cm$^{-3}$ and the selenium atoms 20 having a concentration of $5 \times 10^{17}$ cm$^{-3}$ attract each other and ionically bond with each other, whereby both atoms are neutralized leaving zinc atoms 40 at a concentration of $5 \times 10^{17}$ cm$^{-3}$ in the p type AlInGaP cladding layer 4'.

Figure 2:
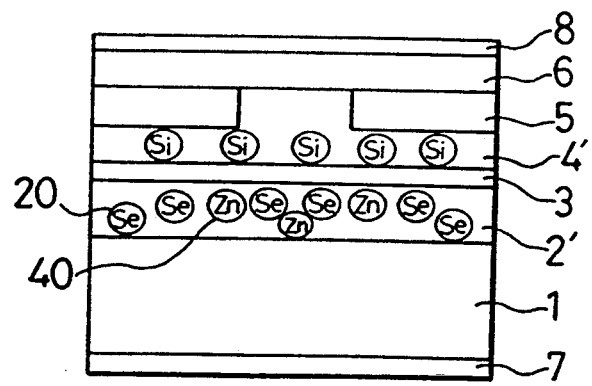
FIG. 2 is a cross-sectional view illustrating a structure of a semiconductor laser in accordance with a second embodiment of the present invention.

FIG. 2 is a cross-sectional view illustrating a structure of a semiconductor laser in accordance with a second embodiment of the present invention. In FIG. 2, the same reference numerals as those shown in FIG. 1 designate the same parts. In FIG. 2, selenium 20 serving as an n type dopant is incorporated into the n type cladding layer 2' at a concentration of $1 \times 10^{18}$ cm$^{-3}$. In addition, zinc 40 is incorporated into the cladding layer 2' at a concentration of $5 \times 10^{17}$ cm$^{-3}$, at which concentration the n type conductivity of the cladding layer 2 is not inverted to p type conductivity. As shown in FIG. 4, the zinc atoms 40 as p type impurities and the selenium atoms 20 as the n type impurities attract each other. The connection between zinc atoms 40 and selenium atoms 20 is so strong that at high temperature in the second and third crystal growth steps shown in FIGS. 1(c) and 1(d) the atoms cannot move individually and zinc atoms 40 are not likely to diffuse into the active layer 3. Therefore, a deep impurity level is not formed in the active layer 3, resulting in a semiconductor laser with reduced threshold current.

The p type impurity concentration of the zinc atoms, $5 \times 10^{17}$ cm$^{-3}$, is chosen to maintain a desired n type impurity concentration. More specifically, the selenium atoms 20 having n type impurity concentration of $1 \times 10^{18}$ cm$^{-3}$ and the zinc atoms 40 having p type impurity concentration of $5 \times 10^{17}$ cm$^{-3}$ attract each other and ionically bond with each other, whereby both atoms are neutralized leaving selenium atoms 20 at a concentration of $5 \times 10^{17}$ cm$^3$ in the p type AlInGaP cladding layer 4'.

In the above-illustrated first and second embodiments, at least one of the p type cladding layer and the n type cladding layer sandwiching the active layer is formed by incorporating first dopant impurities which produce the conductivity type of the cladding layer and a smaller quantity of second dopant impurities which produce conductivity type opposite to that of the cladding layer and ionically bond with the first dopant impurities. Therefore, the n type impurities in the n type cladding layer or the p type impurities in the p type cladding layer mutually attract the impurities producing the opposite conductivity type in each layer at the high temperature in the crystal growth step, so that the p type impurities or the n type impurities cannot move individually and the diffusion of these impurities into the active layer is suppressed. Thereby, no deep impurity level is formed in the active layer, producing a semiconductor laser with a reduced threshold current.

While in the above-illustrated embodiments zinc is employed as the p type dopant for the p type cladding layer 4', other Group II atoms which function as a p type dopant in AlInGaP, such as cadmium, may be used. In addition, although selenium is used as the n type dopant in the p type cladding layer 4' and ionically bonds with the p type dopant, other Group VI atoms such as tellurium or sulfur, may be used.

While in the above-described embodiments selenium is used as the n type dopant for the n type cladding layer 2 or 2', other Group VI atoms which function as an n type dopant in AlInGaP, such as tellurium or sulfur, may be used. In addition, although zinc is used as the p type dopant in the n type cladding layer 2 and ionically bonds with the n type dopant, other Group II atoms, such as cadmium, may be used.

While in the above-illustrated embodiments the active layer 3 comprises InGaP, it may comprise AlInGaP having a smaller energy band gap than that of the cladding layer or a multiple quantum well structure comprising InGaP and AlInGaP.

The semiconductor laser according to the present invention can be constituted by AlGaAs system material with the same effect as described above.

As is evident from the foregoing description, according to the present invention, at least one of a p type cladding layer and an n type cladding layer sandwiching an active layer includes first dopant impurities, which produce the conductivity type of the cladding layer, and a smaller quantity of second dopant impurities which produce a conductivity type opposite to that of the cladding layer and ionically bond with the first impurities. Therefore, the n type impurities in the n type cladding layer or the p type impurities in the p type cladding layer attract the impurities producing the opposite conductivity type in each layer during the crystal growth step, so that the p type impurities or the n type impurities cannot move individually and the diffusion of these impurities into the active layer is suppressed. Thereby, a deep impurity level is not formed in the active layer, resulting in a semiconductor laser with reduced threshold current.

What is claimed is:

1. A semiconductor laser comprising:
    a semiconductor substrate;
    a p type cladding layer, an n type cladding layer, an active layer sandwiched by said p type and n type cladding layers, said layers being disposed on said semiconductor substrate, said p type cladding layer including a first dopant impurity in a first quantity producing the p type conductivity of said p type cladding layer and a second quantity, smaller than said first quantity, of a second dopant impurity producing n type conductivity and ionically bonding with said first dopant impurity; and
    first and second electrodes electrically connected to said p type and n type cladding layers, respectively.

2. The semiconductor laser of claim 1 wherein said first dopant impurity is selected from the group consisting of zinc and cadmium and said second dopant impurity is selected from the group consisting of selenium, tellurium, and sulfur.

3. The semiconductor laser of claim 1 wherein said p type cladding layer and said n type cladding layer comprise AlInGaP.

4. The semiconductor laser of claim 3 wherein said active layer comprises InGaP.

5. The semiconductor laser of claim 1 wherein said active layer comprises a multiple quantum well structure including layers of AlInGaP, InGaP, and AlInGaP.

6. The semiconductor laser of claim 1 wherein said p type cladding layer, said n type cladding layer, and said active layer comprise AlInGaP system material.

7. The semiconductor laser of claim 1 wherein said first dopant impurity is present in a concentration of about $1 \times 10^{18}$ cm$^{-3}$ and said second dopant impurity is present in a concentration of about $5 \times 10^{17}$ cm$^{-3}$.

8. A semiconductor laser comprising:
    a semiconductor substrate;
    a p type cladding layer, an n type cladding layer, an active layer sandwiched by said p type and n type cladding layers, said layers being disposed on said semiconductor substrate, said n type cladding layer including a first dopant impurity in a first quantity producing the n type conductivity of said n type cladding layer and a second quantity, smaller than said first quantity, of a second dopant impurity producing p type conductivity and ionically bonding with said first dopant impurity; and
    first and second electrodes electrically connected to said p type and n type cladding layers, respectively.

9. The semiconductor laser of claim 8 wherein said first dopant impurity is selected from the group consisting of selenium, tellurium, and sulfur and said second dopant impurity is selected from the group consisting of zinc and cadmium.

10. The semiconductor laser of claim 8 wherein said p type cladding layer and said n type cladding layer comprise AlInGaP.

11. The semiconductor laser of claim 10 wherein said active layer comprises InGaP.

12. The semiconductor laser of claim 8 wherein said active layer comprises a multiple quantum well structure including layer of AlInGaP, InGaP, and AlInGaP.

13. The semiconductor laser of claim 8 wherein said p type cladding layer, said n type cladding layer and said active layer comprise AlGaAs system materials.

14. The semiconductor laser of claim 8 wherein said first dopant impurity is present in a concentration of about $1 \times 10^{18}$ cm$^{-3}$ and said second dopant impurity is present in a concentration of about $5 \times 10^{17}$ cm$^{-3}$.

15. A semiconductor laser comprising:

a semiconductor substrate;

a p type cladding layer, an n type cladding layer, an active layer sandwiched by said p type and n type cladding layers, said layers being disposed on said semiconductor substrate, said p type cladding layer including a first dopant impurity in a first quantity producing the p type conductivity of said p type cladding layer and a second quantity, smaller than said first quantity, of a second dopant impurity producing n type conductivity and ionically bonding with said first dopant impurity, said n type cladding layer including a third quantity of a third dopant impurity producing n type conductivity and a fourth quantity, smaller than said third quantity, of fourth dopant impurity producing p type conductivity; and first and second electrodes electrically connected to said p type and n type cladding layers, respectively.

16. The semiconductor laser of claim 15 wherein said first dopant impurity is selected from the group consisting of zinc and cadmium and said second dopant impurity is selected from the group consisting of selenium, tellurium, and sulfur.

17. The semiconductor laser of claim 15 wherein said p type cladding layer and said n type cladding layer comprise AlInGaP.

18. The semiconductor laser of claim 17 wherein said active layer comprises InGaP.

19. The semiconductor laser of claim 15 wherein said active layer comprises a multiple quantum well structure including layers of AlInGaP, InGaP and AlInGaP.

20. The semiconductor laser of claim 15 wherein said p type cladding layer, said n type cladding layer and said active layer comprises AlGaAs system materials.

21. The semiconductor laser of claim 15 wherein said first dopant impurity is present in a concentration of about $1 \times 10^{18}$ cm$^{-3}$ and said second dopant impurity is present in a concentration of about $5 \times 10^{17}$ cm$^{-3}$.

* * * * *